United States Patent
Ko et al.

(10) Patent No.: US 10,248,753 B2
(45) Date of Patent: Apr. 2, 2019

(54) PESSIMISM REDUCTION IN HIERARCHICAL BLOCKAGE AGGRESSORS USING ESTIMATED RESISTOR AND CAPACITOR VALUES

(71) Applicant: International Business Machines Corporation, Armonk, NY (US)

(72) Inventors: Tsz-mei Ko, Poughkeepsie, NY (US); Thomas G. Mitchell, Essex Junction, VT (US); Jason D. Morsey, Hopewell Junction, NY (US); Steven E. Washburn, Poughquag, NY (US); Patrick M. Williams, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 15/288,260

(22) Filed: Oct. 7, 2016

(65) Prior Publication Data
US 2018/0101636 A1    Apr. 12, 2018

(51) Int. Cl.
*G06F 17/50*    (2006.01)

(52) U.S. Cl.
CPC ...... *G06F 17/5081* (2013.01); *G06F 17/5009* (2013.01); *G06F 17/5036* (2013.01); *G06F 17/5077* (2013.01)

(58) Field of Classification Search
CPC .................................................. G06F 17/5068
USPC ........................................ 716/110, 111, 115
See application file for complete search history.

(56) References Cited

U.S. PATENT DOCUMENTS

| | | | |
|---|---|---|---|
| 6,029,117 A * | 2/2000 | Devgan ................ | G01R 31/002 702/58 |
| 6,117,182 A * | 9/2000 | Alpert et al. ....... | G06F 17/5068 703/13 |
| 6,449,753 B1 | 9/2002 | Aingaran et al. | |
| 6,467,069 B2 | 10/2002 | Mehrotra et al. | |
| 6,467,074 B1 | 10/2002 | Katsioulas et al. | |
| 6,594,805 B1 | 7/2003 | Tetelbaum et al. | |
| 6,601,222 B1 | 7/2003 | Mehrotra et al. | |
| 6,732,339 B2 | 5/2004 | Savithri et al. | |
| 6,898,774 B2 | 5/2005 | Alpert et al. | |
| 7,251,797 B2 | 7/2007 | Becer et al. | |
| 7,392,497 B2 | 6/2008 | Fassnacht et al. | |
| 7,685,549 B2 | 3/2010 | Sinha et al. | |

(Continued)

*Primary Examiner* — Sun Lin
(74) *Attorney, Agent, or Firm* — Scully, Scott, Murphy & Presser, P.C.; Steven Meyers, Esq.

(57) ABSTRACT

A method, system, and computer product for performing a coupled noise analysis in an integrated circuit (IC) design include copying one or more victim circuit sections of a victim circuit in the IC design, generating a blockage circuit section that represents a blockage aggressor circuit in the IC design, using the copied one or more victim circuit sections of the victim circuit, determining at least one subcircuit from the blockage circuit section, selecting, for a victim pin on the victim circuit, a power-driven virtual node on the at least one subcircuit, applying a power source to the power-driven virtual node on the at least one subcircuit, calculating a coupled noise at the victim pin contributed by the at least one subcircuit in response to the power source being applied, comparing the coupled noise to a threshold noise level, and altering the IC design when the coupled noise exceeds the threshold noise level.

20 Claims, 9 Drawing Sheets

(56) References Cited

U.S. PATENT DOCUMENTS

| | | |
|---|---|---|
| 7,934,188 B2 | 4/2011 | Alpert et al. |
| 8,402,418 B2 | 3/2013 | Berry et al. |
| 2007/0101303 A1 | 5/2007 | Lien et al. |

* cited by examiner

PESSIMISM REDUCTION IN HIERARCHICAL BLOCKAGE AGGRESSORS USING ESTIMATED RESISTOR AND CAPACITOR VALUES

FIELD

The present disclosure relates to a very-large-scale integration (VLSI) circuit design, and more particularly to, a method, a system, and a computer product for simulating a coupled noise at a victim circuit contributed by blockages in the VLSI circuit design.

BACKGROUND

In hierarchical VLSI circuit designs, design faults can be caused by electrically coupled capacitance between levels of hierarchy. To protect the design against the electrical capacitance coupling, electrically analyzing the hierarchical VLSI designs are required, however, that is challenging mostly due to the fact that allocated wiring resources between the levels of the hierarchy (also known as blockages) provide information for wiring or routing in the designs, but for the most part, lack information for electrical circuits therein. Thus, this will result in an inaccuracy in the noise analysis (e.g., pessimism) coupled with the blockages, and will cause to overpredict a coupled noise by the blockages and overdesign to compensate for the predicted coupled noise which may not really be as large as predicted over design on the VLSI circuit. Thus, a more efficient and accurate technique for analyzing a blockage coupled noise is needed.

BRIEF SUMMARY

In an aspect of the present disclosure, a computer-implemented method for performing a coupled noise analysis in an integrated circuit (IC) design is provided. The method comprises copying one or more victim circuit sections of a victim circuit in the IC, generating a blockage circuit section that represents a blockage aggressor circuit in the IC, using the copied one or more victim sections of the victim circuit, determining a first subcircuit from the blockage circuit section, selecting, for a first victim pin on the victim circuit, a first power-driven virtual node on the first subcircuit, applying a first power source to the selected first power-driven virtual node on the first subcircuit, calculating a first coupled noise at the first victim pin contributed from the first subcircuit in response to the first power source being applied, comparing the first coupled noise at the first victim pin to a threshold noise level, and altering the IC design when the first coupled noise exceeds the threshold noise level. The one or more victim circuit sections are directly connected to the blockage circuit section through at least one coupling capacitor. Circuit elements constituting the first subcircuit are all connected one to another within the blockage circuit section.

In an aspect of the present disclosure, a computer system for performing a coupled noise analysis in designing an integrated circuit (IC) is provided. The system comprises a memory device storing machine executable instructions and at least one processing device coupled to the memory device. The at least one processing device is configured to run the machine executable instructions to perform copying one or more victim circuit sections of a victim circuit in the IC, generating a blockage circuit section that represents a blockage aggressor circuit in the IC, using the copied one or more victim sections of the victim circuit, determining a first subcircuit from the blockage circuit section, selecting, for a first victim pin on the victim circuit, a first power-driven virtual node on the first subcircuit, applying a first power source to the selected first power-driven virtual node on the first subcircuit, and calculating a first coupled noise at the first victim pin contributed from the first subcircuit in response to the first power source being applied, comparing the first coupled noise at the first victim pin to a threshold noise level, and altering the IC design when the first coupled noise exceeds the threshold noise level. The one or more victim circuit sections are directly connected to the blockage circuit section through at least one coupling capacitor. Circuit elements constituting the first subcircuit are all connected one to another within the blockage circuit section.

In an aspect of the present disclosure, a computer program product stored in a computer-readable storage medium having computer readable program instructions. The computer readable program instructions are read and carried out by a processing device for performing a coupled noise analysis in an integrated circuit (IC) design. The method comprises copying one or more victim circuit sections of a victim circuit in the IC, generating a blockage circuit section that represents a blockage aggressor circuit in the IC, using the copied one or more victim sections of the victim circuit, determining a first subcircuit from the blockage circuit section, selecting, for a first victim pin on the victim circuit, a first power-driven virtual node on the first subcircuit, applying a first power source to the selected first power-driven virtual node on the first subcircuit, and calculating a first coupled noise at the first victim pin contributed from the first subcircuit in response to the first power source being applied, comparing the first coupled noise at the first victim pin to a threshold noise level, and altering the IC design when the first coupled noise exceeds the threshold noise level. The one or more victim circuit sections are directly connected to the blockage circuit section through at least one coupling capacitor. Circuit elements constituting the first subcircuit are all connected one to another within the blockage circuit section.

DETAILED DESCRIPTION

Embodiments of the present invention will now be described in detail on the basis of the drawings. However, the following embodiments do not restrict the invention claimed in the claims. Moreover, all combinations of features described in the embodiments are not necessarily mandatory for the architecture of the present invention. Like numbers are assigned to like elements throughout the description of the embodiments of the present disclosure.

Figure 1:
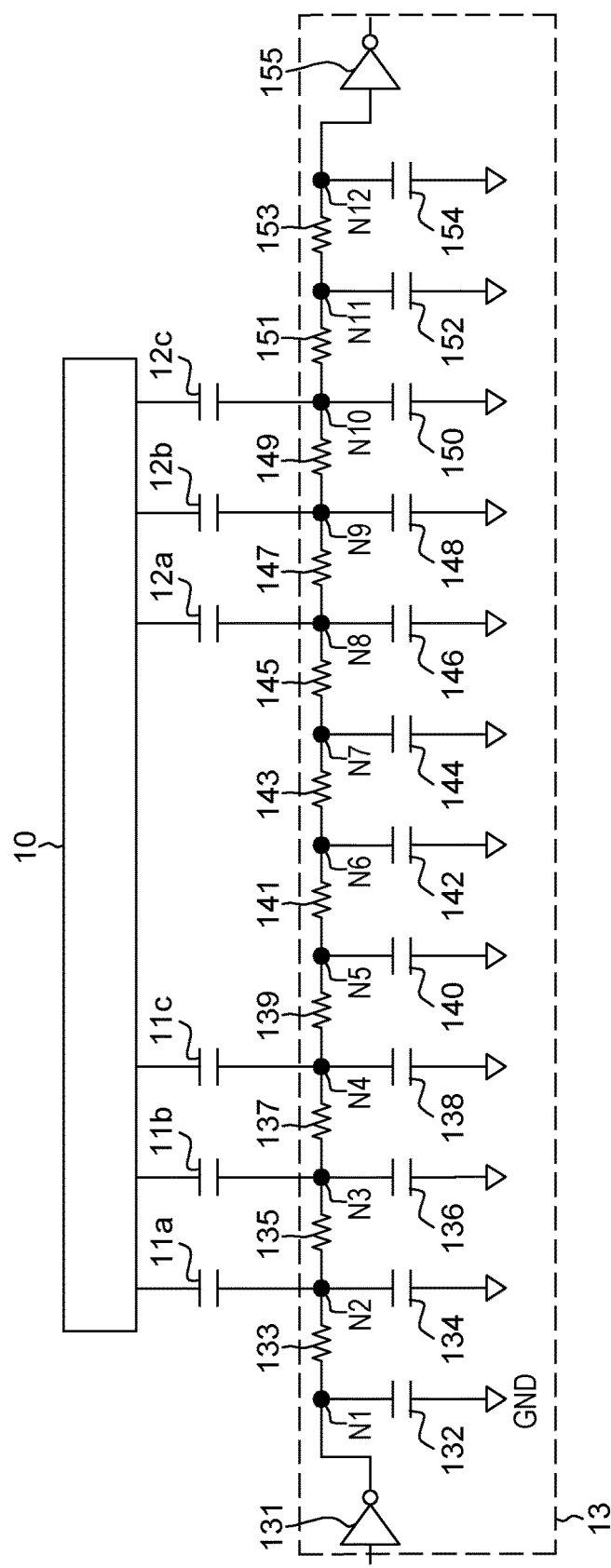
FIG. 1 illustrates an example of a VLSI circuit design including at least one blockage aggressor circuit and a victim circuit according to according to an exemplary embodiment of the present disclosure.

FIG. 1 illustrates an example of a VLSI circuit design 1 including at least one blockage aggressor circuit and a victim circuit according to an exemplary embodiment of the present disclosure.

Referring to FIG. 1, the VLSI circuit design 1 may include a victim circuit 13 and at least blockage aggressor circuit 10. A blockage aggressor circuit (or blockage circuit) may be understood to mean, but is not limited to, a specific location where placing of specific circuits such as cells are prevented or blocked, and may be electrically coupled to a victim circuit, resulting in a coupled noise at the victim circuit (e.g., 13) contributed by the blockage aggressor circuit (e.g., 10). The victim circuit 13 may include, but is not limited to, a plurality of resistors 133, 135, 137, . . . , and 153, a plurality of capacitors 132, 134, 136, . . . , and 154, and a plurality of active circuit elements 131 and 155 such as amplifiers, inverters, or the like. For example, the resistors 133, 135, 137, . . . , and 153 and the active elements 131 and 155 may be connected in a series through nodes N1 to N12, and a respective one side of each of the capacitors 132, 134, 136, . . . , and 154 may be connected to a corresponding one of the resistors 133, 135, 137, . . . , 153 at each of the nodes N1 to N12, and a respective other side of each of the capacitors 132, 134, 136, . . . , and 154 may be connected to a ground GND. However, this is only an illustrative purpose, the present disclosure is not limited thereto. Also, hereinafter, combinations of the resistors (e.g., 133, 135, 137, . . . , and 153) and the capacitors (e.g., 132, 134, 136, . . . , and 154) may collectively be referred to as "RC elements (or circuits)". Further, an output of the active circuit element 131 may be coupled to a node N1 connecting the resistor 133 and the capacitor 132, and an input of the active circuit element 155 may be coupled to a node N12 connecting the resistor 153 and the capacitor 154.

In an example shown in FIG. 1, capacitance couplings occurring between the blockage aggressor circuit 10 and the victim circuit 13 are modeled using coupling capacitors 11a to 11c and 12a to 12c. The blockage aggressor circuit 10 may be coupled to nodes N2 to N4 of the victim circuit 13 through the coupling capacitors 11a to 11c. Thus, a noise (e.g., crosstalk) generated due to the blockage aggressor circuit 10 may be transferred to the victim circuit 13 through the coupling capacitors 11a to 11c, each of which is coupled between the blockage aggressor circuit 10 and a corresponding one of the nodes N2 to N4 of the victim circuit 13. Similarly, the blockage aggressor circuit 10 may be coupled to nodes N8 to N10 of the victim circuit 13 through the coupling capacitors 12a to 12c. Thus, a noise (e.g., crosstalk) generated due to the blockage aggressor circuit 10 may be transferred to the victim circuit 13 through the coupling capacitors 12a to 12c, each of which is coupled between the blockage aggressor circuit 10 and a corresponding one of the nodes N8 to N10 of the victim circuit 13. In an example depicted in FIG. 1, the nodes N5 to N8 of the victim circuit 13 are not connected to any coupling capacitor.

In one embodiment, in order to analyze an impact of the coupled noise (e.g., crosstalk) due to the blockage aggressor circuit 10 to the victim circuit 13, the blockage aggressor circuit 10 can be modeled with a virtual RC circuit. For example, since an electrical circuit configuration of the blockage aggressor circuit 10 is unknown, a section of the victim circuit 13 can be used to provide (or represent) a virtual RC circuit within the blockage aggressor circuit 10.

Figure 2:
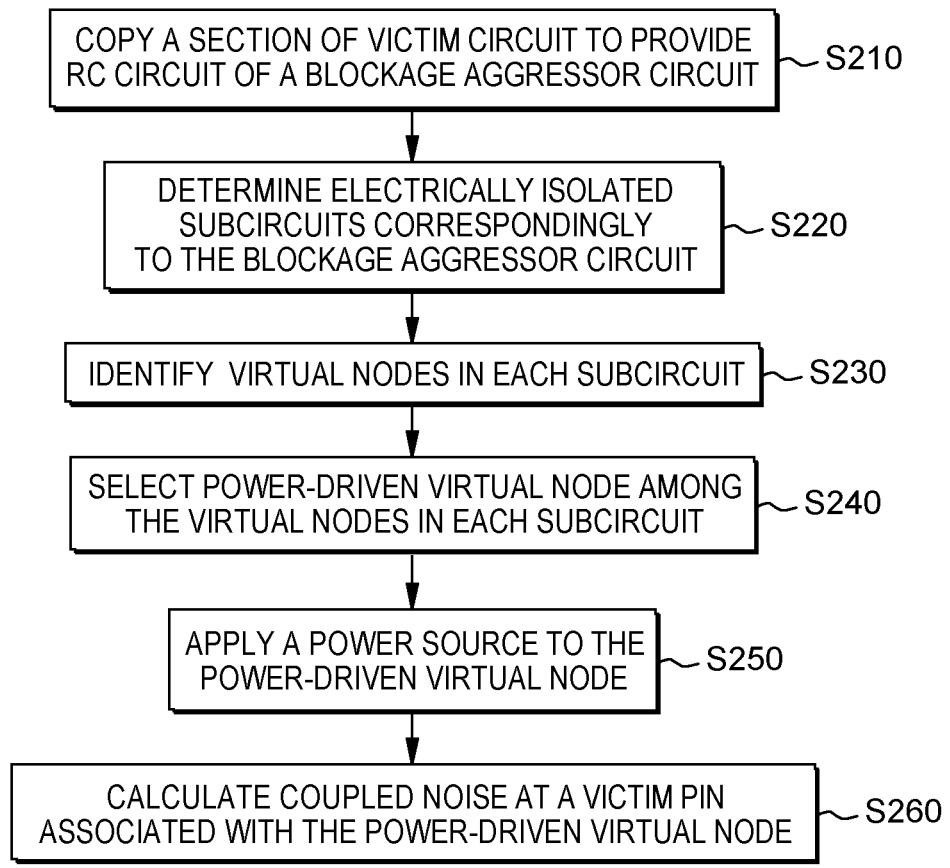
FIG. 2 is a flow chart illustrating a method for performing a coupled noise analysis between a blockage aggressor circuit and a victim circuit according to an exemplary embodiment of the present disclosure.
Figure 3A:
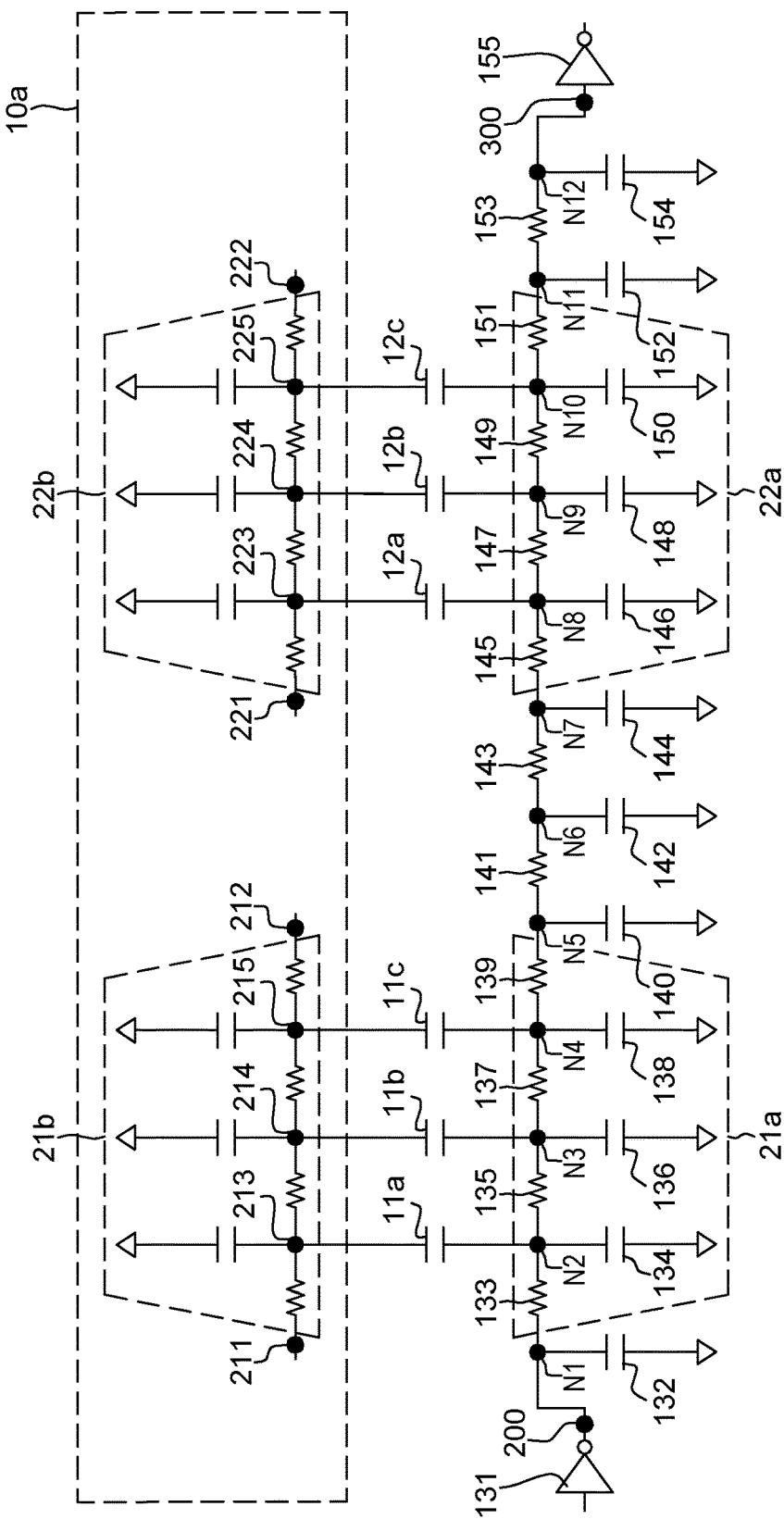
FIGS. 3A to 3C each illustrate an exemplary circuit diagram for performing a coupled noise analysis between a blockage aggressor circuit and a victim circuit according to an exemplary embodiment of the present disclosure.
Figure 3B:
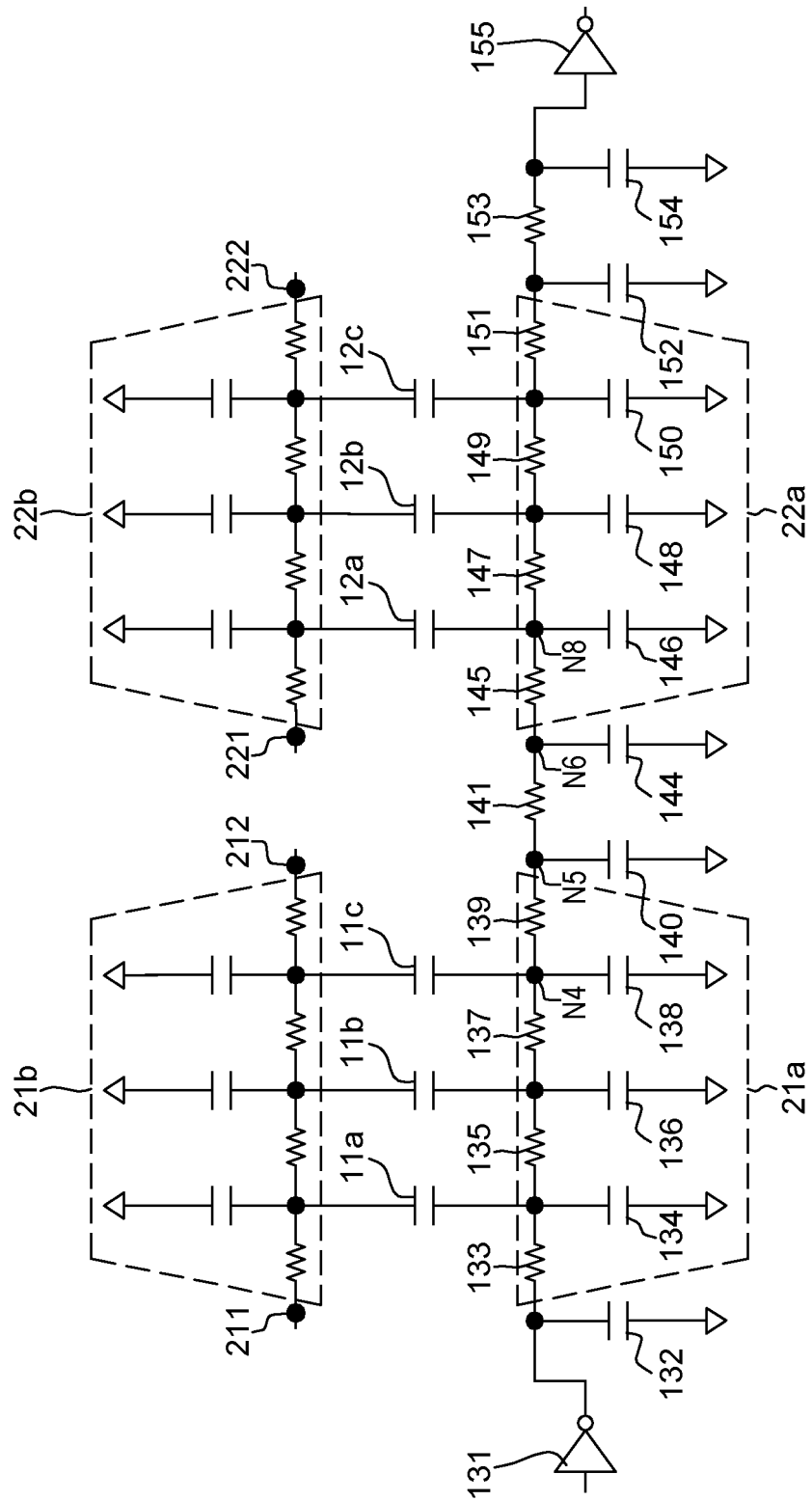
Figure 3C:
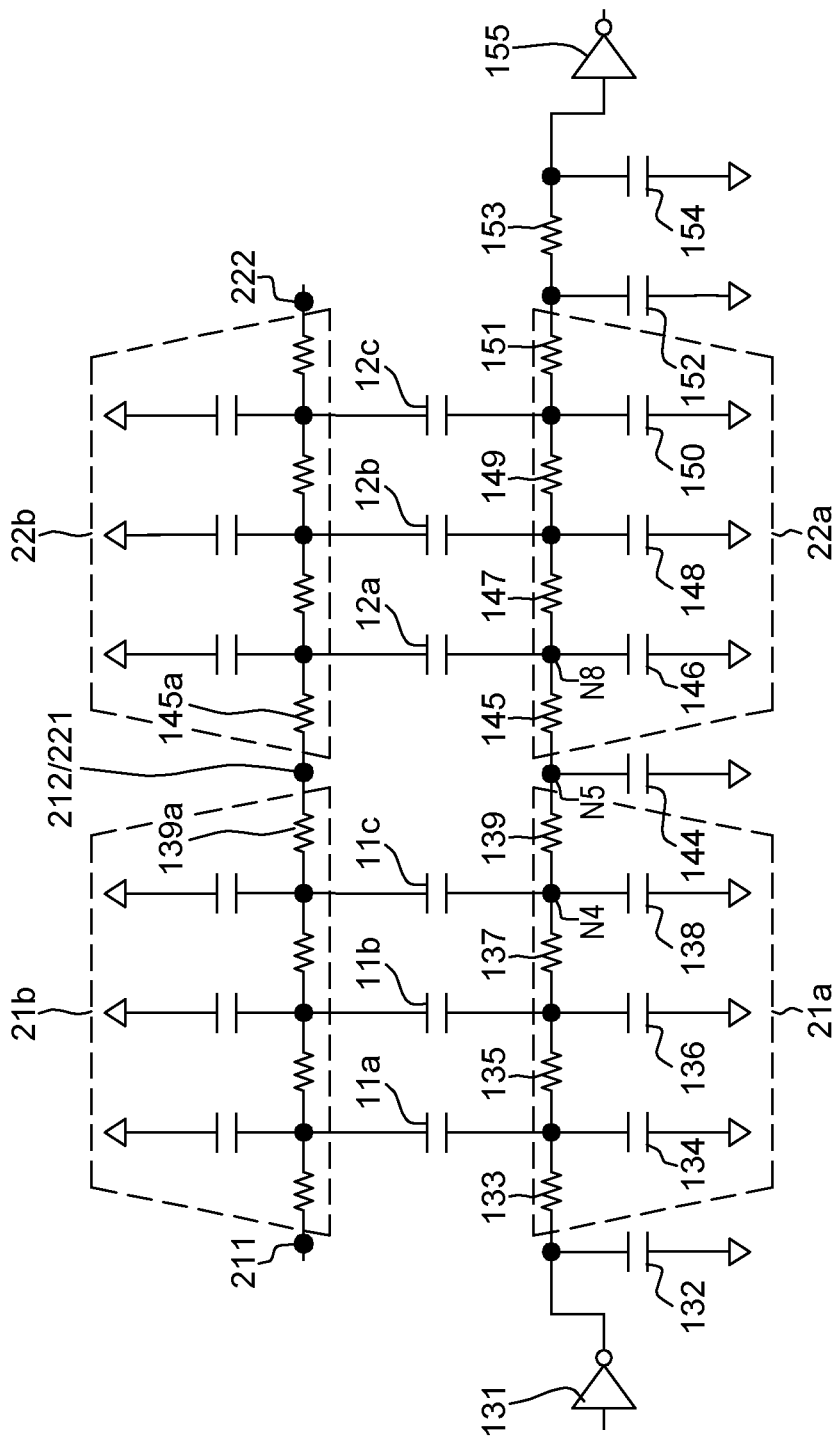
Figure 4:
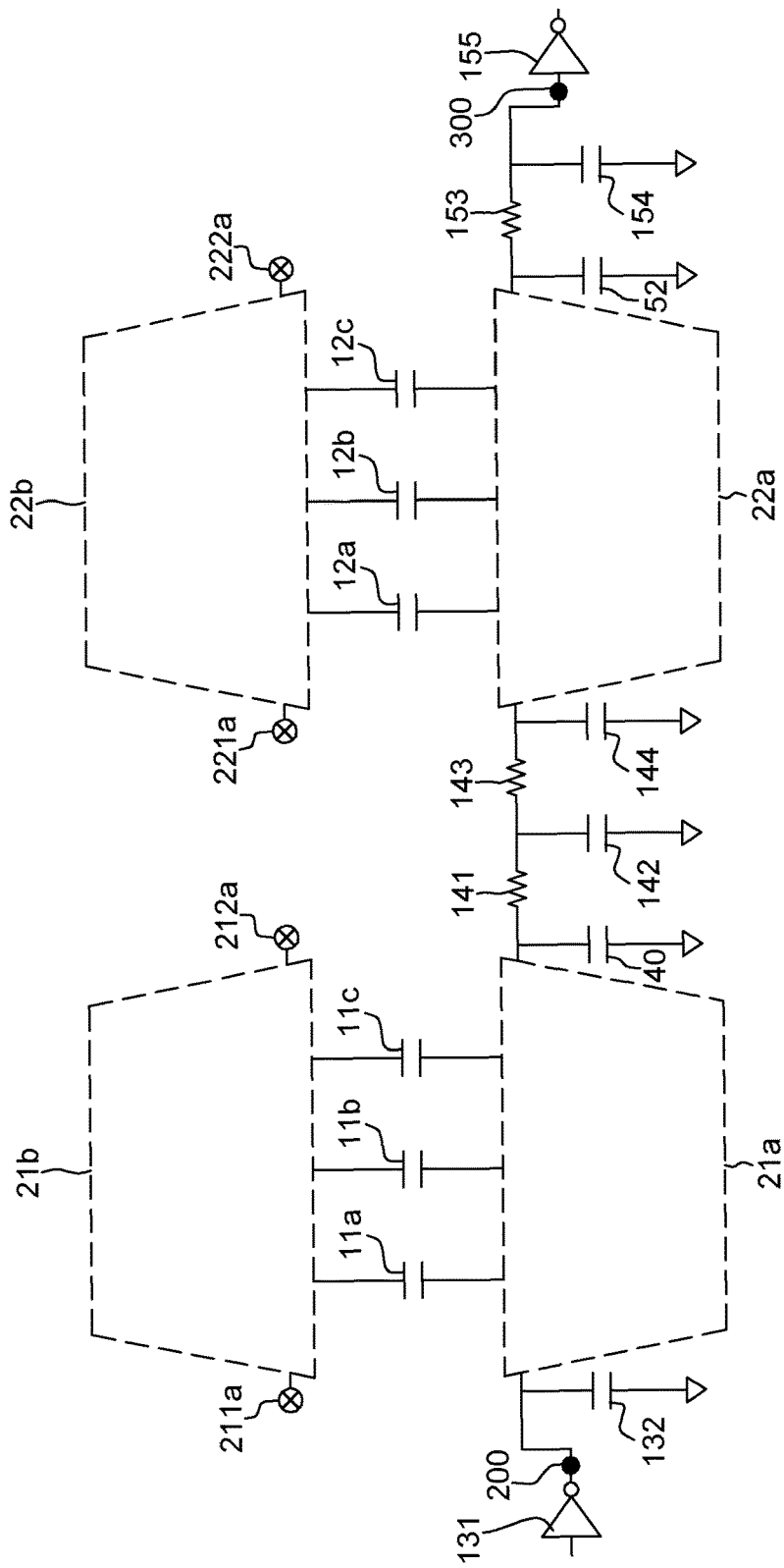
FIG. 4 illustrates a simple form of the circuit diagram of FIG. 3A where a power source applied to each subcircuit is shown according to an exemplary embodiment of the present disclosure.

FIG. 2 is a flow chart illustrating a method for performing a coupled noise analysis between a blockage aggressor circuit and a victim circuit according to an exemplary embodiment of the present disclosure. FIGS. 3A to 3C each illustrate an exemplary circuit diagram for performing a coupled noise analysis between a blockage aggressor circuit and a victim circuit according to an exemplary embodiment of the present disclosure. FIG. 4 illustrates a simple form of the circuit diagram of FIG. 3A where power sources applied to subcircuits are shown according to an exemplary embodiment of the present disclosure.

A victim circuit 13 and coupling capacitors 11a to 11c and 12a to 12c of FIG. 3A have same configurations as those of the circuit diagram 1 of FIG. 1. Thus, duplicate description thereof may be omitted for the sake of simplicity.

Thus, referring to FIGS. 1, 2, and 3A, at first step S210 of FIG. 2, sections 21a and 22a of the victim circuit 13 (FIG. 3A) may be copied and provided as the blockage circuit section 10a (with RC elements) for the blockage aggressor circuit 10; for example, the blockage circuit section 10a (FIG. 3A) that represents the blockage aggressor circuit 10 may be generated using the copied sections 21a and 22a of the victim circuit 13. Each section 21a and 22b to be copied may be selected to include resistors and capacitors which are directly connected to coupling capacitors. For example, the section 21a to be copied, as depicted in FIG. 3A, includes resistors 133, 135, 137 and 139 and capacitors 134, 136 and 138. In such section 21a, the resistors 133 and 135 and the capacitor 134 are commonly connected to a coupling capacitor 11a through a node N2; the resistors 135 and 137 and the capacitor 136 are commonly connected to a coupling capacitor 11b through a node N3; and the resistors 137 and 139 and the capacitor 138 are commonly connected to a coupling capacitor 11c through a node N3. By a further example, the section 22a to be copied, as depicted in FIG. 3A, includes resistors 145, 147, 149 and 151 and capacitors 146, 148 and 150. In such section 22a, the resistors 145 and 147 and the capacitor 146 are commonly connected to a coupling capacitor 12a through a node N8; the resistors 147 and 149 and the capacitor 148 are commonly connected to a coupling capacitor 12b through a node N9; and the resistors 149 and 151 and the capacitor 150 are commonly connected to a coupling capacitor 12c through a node N10. In addition, the resistors 141, 143 and 153 and the capacitors 132, 140, 142, 144, 152 and 154 may remain without being copied.

In an example depicted in FIG. 3A, two circuit blocks 21b and 22b are provided by copying respective sections 21a and 22a of the victim circuit 13. Thus, the circuit block 21b (or 22b) may be a mirrored circuit of the section 21a (or 22a) with respect to the group of coupling capacitors 11a to 11c (or 12a to 12c). For example, the circuit block 21b (or 22b) may have a same circuit configuration as the section 21a (or 22a) with respect to the group of coupling capacitors 11a to 11c (or 12a to 12c).

Referring again to FIGS. 2 and 3A, the circuit blocks 21b and 22b may be determined as subcircuits in operations of step S220. In the present disclosure, a subcircuit is defined as a circuit which is not directly connected to other subcircuit except an indirect connection through a victim circuit; for example, circuit elements (e.g., RC elements) constituting a subcircuit are all connected one to another within the blockage circuit section 10a. For example, without the victim circuit, subcircuits within the blockage circuit section 10a are electrically isolated one from another. In one embodiment, subcircuits may be determined using a distance between adjacent groups of coupling capacitors. In an example depicted in FIG. 3A, the two adjacent groups of coupling capacitors 11a to 11c and 12a to 12c are shown. Also, shown is that a coupling capacitor 11c of the group of coupling capacitors 11a to 11c (associated with the subcircuit 21b) is apart from a coupling capacitor 12a of the group of coupling capacitors 12a to 12c by a distance of four nodes (e.g., a distance between the node N4 to the node N8 of FIG. 3A); for example, three nodes N5 to N7 exist on a shortest connection path between the coupling capacitor 11c and the coupling capacitor 12a. In this case, between the two groups of coupling capacitors 11a to 11c and 12a to 12c, there exists at least one resistor (two resistors 141 and 143) which has no direct connection to a coupling capacitor, which results in a determination such that the two circuit blocks 21b and 22b are separated subcircuits within the blockage circuit section 10a.

FIG. 3B illustrates an exemplary circuit diagram wherein two adjacent groups of coupling capacitors are apart from each other by a distance of three nodes according to an exemplary embodiment of the present disclosure. Referring to FIG. 3B, a coupling capacitor 11c of the group of coupling capacitors 11a to 11c (associated with the subcircuit 21b) is apart from a coupling capacitor 12a of the group of coupling capacitors 12a to 12c by a distance of three nodes (e.g., a distance between the node N4 to the node N8 of FIG. 3B); for example, two nodes N5 and N6 exist on a shortest connection path between the coupling capacitor 11c and the coupling capacitor 12a. Thus, there exists a single resistor 141 which has no direct connection to a coupling capacitor, and thus, two circuit blocks 21b and 22b can still be determined as separated subcircuits.

FIG. 3C illustrates an exemplary circuit diagram wherein two adjacent groups of coupling capacitors are apart from each other by a distance of two nodes according to an exemplary embodiment of the present disclosure. Referring to FIG. 3C, a coupling capacitor 11c of the group of coupling capacitors 11a to 11c (associated with the subcircuit 21b) is apart from a coupling capacitor 12a of the group of coupling capacitors 12a to 12c by a distance of two nodes (e.g., a distance between the node N4 to the node N8 of FIG. 3C); for example, a single node N5 exists on a shortest connection path between the coupling capacitor 11c and the coupling capacitor 12a. As illustrated, the two circuit blocks 21b and 22b are so close that a rightmost resistor 139a of the circuit block 21b and a leftmost resistor 145a of the circuit block 22b are physically connected to each other. Thus, in this case, the two circuit blocks 21b and 22b may no longer be electrically isolated from each other, and thus determined as a single subcircuit. For example, in such example illustrated in FIG. 3C, the blockage aggressor circuit 10 may be modeled to include a single subcircuit.

Further, although not shown in the present disclosure, in case where the two adjacent groups of coupling capacitors 11a to 11c and 12a to 12c are apart from each other by more than four nodes (when there exist more than three resistors that have no connection to a coupling capacitor), the circuit blocks 21b and 22b, correspondingly coupled to each of the groups of coupling capacitors 11a to 11c and 12a to 12c, may be determined as separated subcircuits.

Referring back to an example depicted in FIG. 3A, two subcircuits 21b and 22b may be determined (or identified) correspondingly to the blockage aggressor circuit 10 (FIG. 1). The number of subcircuits determined correspondingly to a certain blockage aggressor circuit may vary depending on how coupling capacitors are configured as described above. If adjacent two coupling capacitors are separated by a distance of more than two nodes, there may exist two subcircuits each corresponding to one of the adjacent coupling capacitors. Thus, if there are N pairs of adjacent coupling capacitors, each pair of which is separated by the distance of more than two nodes, the number of subcircuits to be determined may be N+1. Here, N is an integer equal to or greater than one.

Referring back to FIG. 2, at step S230, virtual nodes may be identified on each subcircuit 21b (or 22b). The virtual nodes may include external and internal virtual nodes. In an example depicted in FIG. 3A, external virtual nodes 211 and 212 and internal virtual nodes 213 to 215 may be identified for the subcircuit 21b, and external virtual nodes 221 and 222 and internal virtual nodes 223 to 225 may be determined for the subcircuit 22b. The external virtual nodes may be understood as end nodes of a certain subcircuit.

At step S240 (FIG. 2), at least one of the virtual nodes identified in the step S230 may be selected as a power-driven virtual node to which a circuit excitation (e.g., a power source such as a voltage or current source) may be applied to excite a corresponding subcircuit, which facilitates a coupled noise analysis (simulation or calculation) at a corresponding victim pin on the victim circuit 13 contributed by the corresponding subcircuit. For example, a circuit simulation can be made with a power source (e.g., voltage or current source) located at one of the virtual nodes (particularly external virtual nodes) on the subcircuit, and the coupled noise at the victim pin contributed by the subcircuit may be calculated. A value of the coupled noise at the victim pin may be dependent on a location of the selected power-driven virtual node. Thus, in one embodiment, to simulate the "worst case noise scenario" where a largest coupled noise is calculated at a victim pin, an external virtual node with a shortest physical distance to such victim pin can be selected as a power-driven virtual node. Hereinafter, the "worst case noise scenario" is assumed, otherwise indicated explicitly.

In one embodiment, with respect to the subcircuit 21b depicted in FIG. 3A, the external virtual node 211, which is closer to a victim pin 200 (on the victim circuit 13) than any other nodes 212 to 215 therein, is determined as a power-driven virtual node to which a circuit excitation (e.g., power source) is applied to facilitate a coupled noise analysis at a victim pin 200 contributed by the subcircuit 21b. Further, the external virtual node 212, which is closer to a victim pin 300 (on the victim circuit 13) than any other nodes 211 and 213 to 215 therein, is determined as a power-driven virtual node to which a circuit excitation (e.g., power source) is applied to facilitate a coupled noise analysis at the victim pin 300 contributed by the subcircuit 21b.

Similarly, with respect to the subcircuit 22b depicted in FIG. 3A, the external virtual node 221, which is closer to the victim pin 200 than any other nodes 222 to 225 therein, is determined as a power-driven virtual node to which a circuit excitation is applied to facilitate a coupled noise analysis at the victim pin 200 contributed by the subcircuit 22b. Further, the external virtual node 222, which is closer to the victim pin 300 than any other nodes 221 and 223 to 225 therein, is determined as a power-driven virtual node to which a circuit excitation is applied to facilitate a coupled noise analysis at the victim pin 300 contributed by the subcircuit 22b.

In addition, at step S250 (FIG. 2), a circuit excitation (e.g., power source) may be applied to the power-driven virtual node selected in the step S240. FIG. 4 illustrates an example of applying power sources to selected power-driven virtual nodes according to an exemplary embodiment of the present disclosure. A circuit configuration of FIG. 4 is the same as that of FIG. 3A, but details of circuit blocks 21a, 22a, 21b, and 22b thereof are omitted for the sake of the simplicity. Referring to FIG. 4, a power source (e.g., voltage or current driver) 211a associated with the victim pin 200 may be applied to the power-driven virtual node 211 of the subcircuit 21b, and a power source 221a associated with the victim pin 200 may be applied to the power-driven virtual node 221 of the subcircuit 22b. Similarly, a power source 212a associated with the victim pin 300 may be applied to the power-driven virtual node 212 of the subcircuit 21b, and a power source 222a associated with the victim pin 300 may be applied to the power-driven virtual node 222 of the subcircuit 22b.

In addition, at step S260 (FIG. 2), a coupled noise at a victim pin may be calculated when the power source is applied to the power-driven virtual node as described in the step S250. In an example shown in FIG. 4 again, when the power sources 211a and 221a are applied to the power-driven virtual node 211 and 221, respectively, a coupled noise at the victim pin 200 may be calculated. Similarly, when the power sources 212a and 222a are applied to the power-driven virtual node 212 and 222, respectively, a coupled noise at the victim pin 300 may be calculated.

In one embodiment, the power sources 211a, 221a, 212a, and 222a may be applied individually (or independently). Thus, a total coupled noise at the victim pin 200 contributed by the subcircuits 21b and 22b may be simulated by applying the power sources 211a and 221a individually (or independently) to excite each of the subcircuits 21b and 22b. In one embodiment, the power source 211a may be applied to excite the subcircuit 21b and a first coupled noise at the victim pin 200 may be calculated, and then the power source 221a may be applied to excite the subcircuit 22b and a second coupled noise at the victim pin 200 may be calculated. Next, a sum of the first and second coupled noises at the victim pin 200 may be calculated as the total coupled noise at the victim 200 contributed by the subcircuits 21b and 22b. Similarly, a total coupled noise at the victim pin 300 may be simulated by applying the power sources 212a and 222a individually (or independently) to excite each of the subcircuits 21b and 22b. In one embodiment, the power source 212a may be applied to excite the subcircuit 21b and a first coupled noise at the victim pin 300 may be calculated, and then the power source 222a may be applied to excite the subcircuit 22b and a second coupled noise at the victim pin 300 may be calculated. Next, a sum of the first and second coupled noises at the victim pin 300 may be calculated as the total coupled noise at the victim 300 contributed by the subcircuits 21b and 22b.

In one embodiment, for each victim pin, all power sources corresponding to the corresponding victim pin may simultaneously be applied to subcircuits. For example, the power sources 211a and 221a may be applied simultaneously to excite of each of the subcircuits 21b and 22b, and a noise at the victim pin 200 at this time may be calculated as a total coupled noise. Similarly, the power sources 212a and 222a may be applied simultaneously to excite of each of the subcircuits 21b and 22b, and a noise at the victim pin 300 at this time may be calculated as a total coupled noise.

In one embodiment (although not shown in figures), at least one of the above-described steps S210 to S260 can be embodied using a circuit simulator (e.g., SPICE).

By way of example only, referring to FIGS. 1 and 3A, to calculate a coupled noise at a victim pin (e.g., 200 or 300), a circuit block with an aggressor blockage circuit section (e.g., 10a) and a victim circuit (e.g., 13) may be built on the circuit simulator, and a power source (e.g., 211a, 212a, 221a, or 222a) may be applied to a virtual node of the blockage circuit section. If the power source applied to the blockage circuit section in the circuit simulator is a time-variant voltage or current source, there may correspondingly occur a time-variant voltage or current noise signal at the victim pin. This time-variant voltage or current noise signal may correspond to a coupled noise at the victim pin. For example, various parameters (e.g., peak amplitude value, a root-mean square (RMS)) of the voltage or current noise signal may be calculated as a coupled noise at the victim pin.

In one embodiment, a respective total coupled noise value at each victim pin contributed by one or more subcircuits may be used as an indicator showing possibility of circuit failures or malfunctions due to the coupled noise, which facilitates a circuit design optimization. In one example, a total coupled noise value at a certain victim pin may be compared to a threshold noise level (e.g., noise immunity) of the corresponding victim pin. The threshold noise level of the victim pin may be a reference level at which a circuit failure or malfunction at the victim pin begins to occur. Thus, if the total coupled noise value at the victim pin exceeds the threshold noise level, a circuit design may be altered to reduce the total coupled noise value to be lower than the threshold noise level and to avoid such circuit failure or malfunction. For example, the altering of the circuit design may include, but is not limited to, rerouting (or rewiring) of wire paths (or connections) associated with the victim pin or redeploying of circuit elements in the circuit design.

By way of example only, assuming a logic circuit designed to function to switch from one state to other state, if a total coupled noise value at a victim pin in the logic circuit is lower than a threshold noise level, the logic circuit may function to switch even with the coupled noise present. However, the total coupled noise value exceeding the threshold level may possibly cause the logic circuit or a device including the circuit to switch incorrectly. In a further example, if an undesired delay (on a signal path associated with the victim pin) due to the coupled noise is one of sources causing such malfunction in the logic circuit, the circuit design may be changed to reduce such delay by rerouting wire paths associated with the victim pin.

In one embodiment, the threshold noise level may be predetermined through a simulation for a victim circuit (e.g., 13) using the circuit simulator. For example, a simulation model of the victim circuit may be built on the circuit simulator and simulated while increasing an amount of noise added to an input of the victim circuit. The largest amount of noise in this simulation that does not cause malfunction on the victim circuit may be predetermined as the threshold noise level.

In another example, the total coupled noise value may be related to a switching speed of the logic circuit. Functionally, the logic circuit may be supposed to operate in a designed speed if the noise value is below the above described threshold level; however if the coupled noise value exceeds the threshold level, it may cause an unwanted delay in operation speed (e.g., switching speed) of the logic circuit (For example, the coupled noise can cause the logic to switch faster than designed (or slower than designed)). This can cause an overall circuit delay in a device including the logic circuit. The larger the coupled noise value, the larger the circuit delay in the logic circuit. Thus, one application of the coupled noise simulation according to an exemplary embodiment of the present disclosure is to use the determined coupled noise value to compute a circuit delay caused by the coupled noise and to change the circuit design (as described above) if the circuit delay is out of an expected range.

Figure 5A:
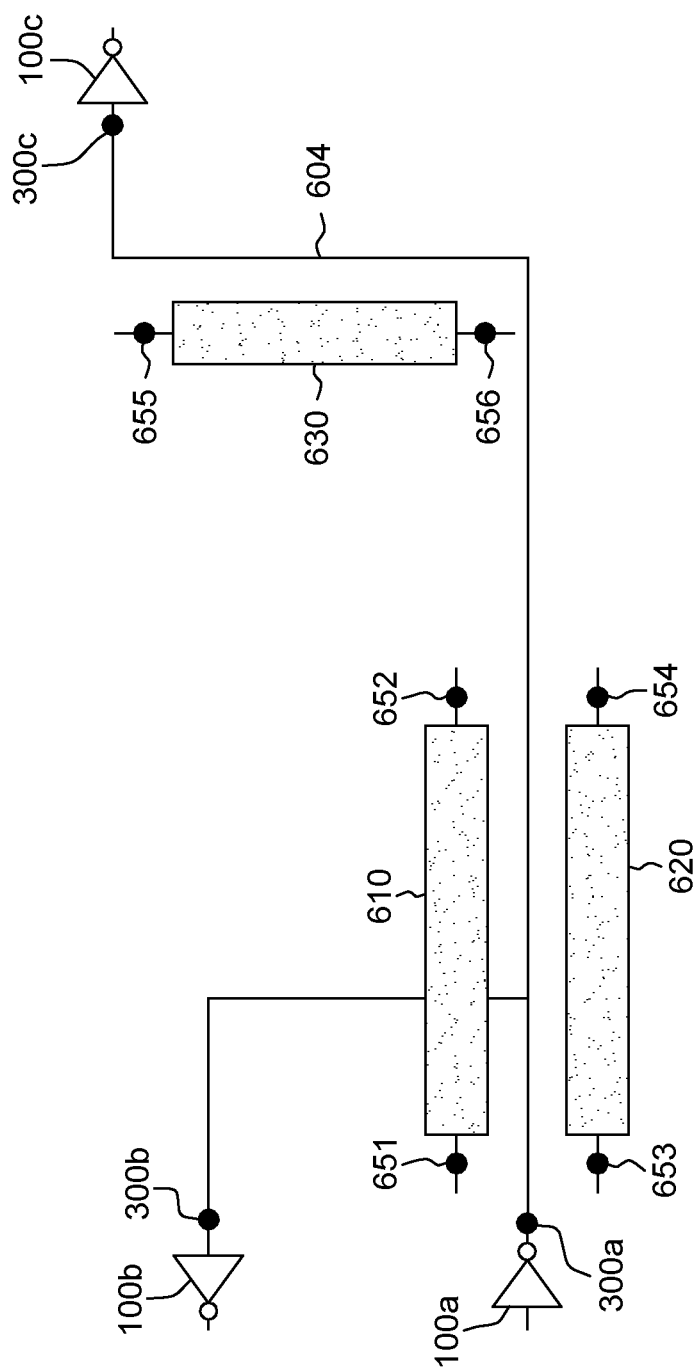
FIGS. 5A and 5B each illustrate an example of a coupled noise analysis model in a circuit design according to an exemplary embodiment of the present disclosure.
Figure 5B:
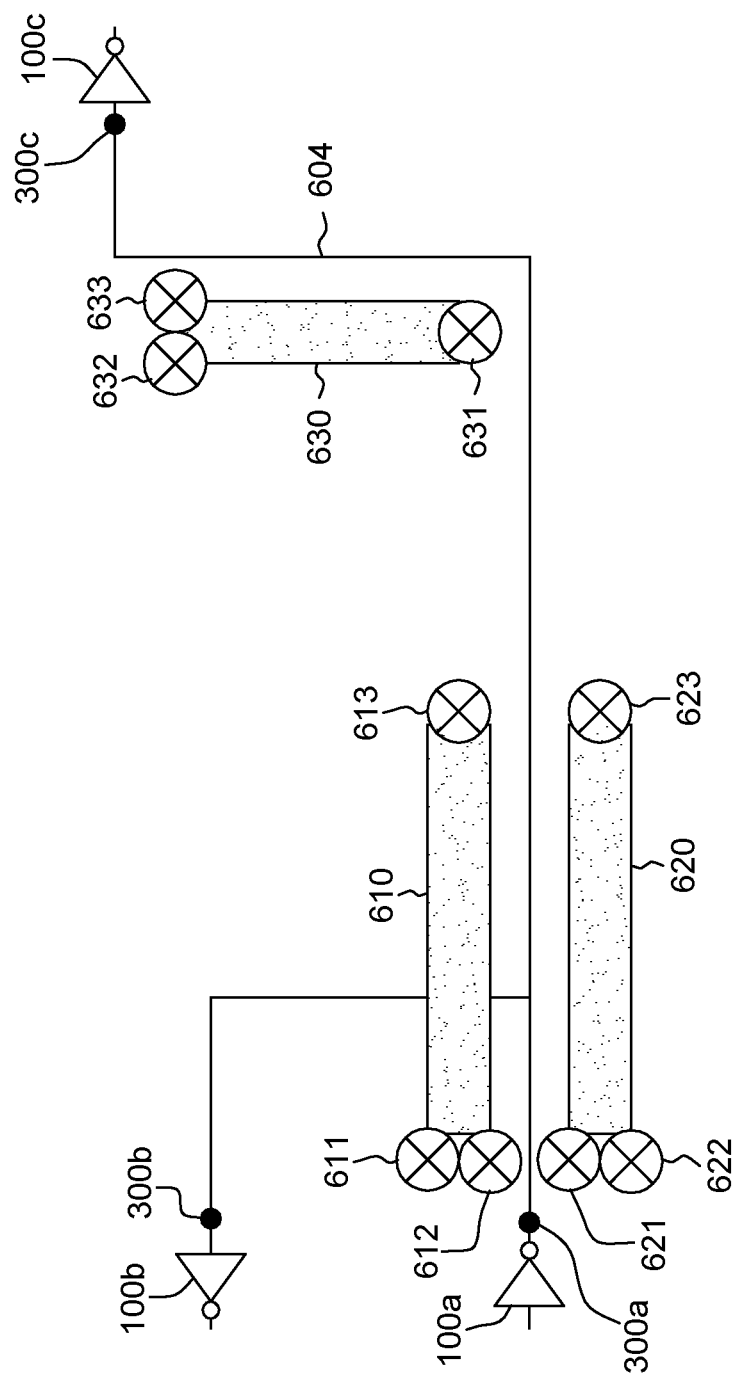

FIGS. 5A and 5B each illustrate an example of a coupled noise analysis model in a circuit design according to an exemplary embodiment of the present disclosure.

Shown in FIG. 5A are three subcircuits 610 to 630, three victim pins 300a to 300c, and active elements 100a to 100c (e.g., amplifiers and inverters) for illustrative purpose. As shown in FIG. 5A, each of the three victim pins 300a to 300c may be either an input or output node of a corresponding one of the active elements 100a to 100c. Although not shown in detail, a victim circuit 604 may include RC circuits with a similar configuration to the victim circuit 13 depicted in FIG. 3A, and each subcircuit 610 to 630 may be provided by copying some sections of the victim circuit 604, as described above. Thus, duplicate descriptions thereof will be omitted for the sake of simplicity. Further, the subcircuits 610 to 630 may be disconnected (electrically isolated) one from another except within the victim circuit 604.

Referring to FIGS. 5A and 5B, for the subcircuit 610, an external virtual node 651 (FIG. 5A) (with a shortest physical distance to the victim pin 300a, in the subcircuit 610) may be selected as a power-driven virtual node to which a power source 611 (FIG. 5B) is applied to simulate or calculate a coupled noise at the victim pin 300a contributed by the subcircuit 610. Further, the external virtual node 651 (FIG. 5A) (with a shortest physical distance to the victim pin 300b, in the subcircuit 610) may also be selected as a power-driven virtual node to which a power source 612 (FIG. 5B) is applied to simulate or calculate a coupled noise at the victim pin 300b contributed by the subcircuit 610. Further, an external virtual node 652 (FIG. 5A) (with a shortest physical distance to the victim pin 300c, in the subcircuit 610) may be determined as a power-driven virtual node to which a power source 613 (FIG. 5B) is applied to simulate or calculate a coupled noise at the victim pin 300c contributed by the subcircuit 610.

In addition, referring to FIGS. 5A and 5B, for the subcircuit 620, an external virtual node 653 (FIG. 5A) (with a shortest physical distance to the victim pin 300a, in the subcircuit 620) may be selected as a power-driven virtual node to which a power source 621 (FIG. 5B) is applied to simulate or calculate a coupled noise at the victim pin 300a contributed by the subcircuit 620. Further, the external virtual node 653 (FIG. 5A) (with a shortest physical distance to the victim pin 300b, in the subcircuit 620) may also be selected as a power-driven virtual node to which a power source 622 (FIG. 5B) is applied to simulate or calculate a coupled noise at the victim pin 300b contributed by the subcircuit 620. Further, an external virtual node 654 (FIG. 5A) (with a shortest physical distance to the victim pin 300c, in the subcircuit 620) may be determined as a power-driven virtual node to which a power source 623 (FIG. 5B) is applied to simulate or calculate a coupled noise at the victim pin 300c contributed by the subcircuit 620.

In addition, referring to FIGS. 5A and 5B, for the subcircuit 630, an external virtual node 656 (FIG. 5A) (with a shortest physical distance to the victim pin 300a, in the subcircuit 630) may be selected as a power-driven virtual node to which a power source 631 (FIG. 5B) is applied to simulate or calculate a coupled noise at the victim pin 300a contributed by the subcircuit 630. An external virtual node 655 (FIG. 5A) (with a shortest physical distance to the victim pin 300b in the subcircuit 630) may be selected as a power-driven virtual node to which a power source 632 (FIG. 5B) is applied to simulate or calculate a coupled noise at the victim pin 300b contributed by the subcircuit 630. Further, the external virtual node 655 (FIG. 5A) (with a shortest physical distance to the victim pin 300c in the subcircuit 630) may also be selected as a power-driven virtual node to which a power source 633 (FIG. 5B) is applied to simulate or calculate a coupled noise at the victim pin 300c contributed by the subcircuit 630.

Figure 6:
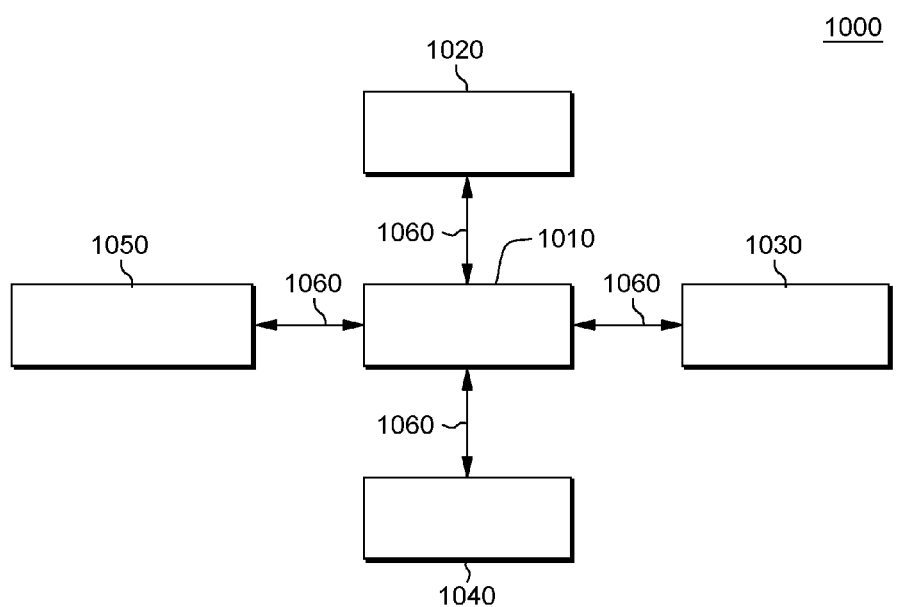
FIG. 6 is a block diagram of a computing system according to an exemplary embodiment of the present disclosure.

FIG. 6 is a block diagram of a computing system 1000 according to a non-limiting exemplary embodiment of the present disclosure.

Referring to FIG. 6, the computing system 1000 may be used as a platform for performing (or controlling) the functions or operations described hereinabove with reference to FIGS. 2, 3A-3C, 4, 5A, and 5B.

In addition, the computing system 1000 may be implemented with a ultra-mobile personal computer (UMPC), a net-book, a personal digital assistance (PDA), a portable computer (PC), a web tablet, a wireless phone, a mobile phone, a smart phone, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, or the like.

Referring to FIG. 6, the computing system 1000 may include a processor 1010, I/O devices 1020, a memory system 1030, a display device 1040, and a network adaptor 1050.

The processor 1010 may drive the I/O devices 1020, the memory system 1030, the display device 1040, and the network adaptor 1050 through a bus 1060.

The computing system 1000 may include a program module for performing (or controlling) the functions or operations described hereinabove with reference to FIGS. 2, 3A-3C, 4, 5A, and 5B according to exemplary embodiments. For example, the program module may include routines, programs, objects, components, logic, data structures, or the like, for performing particular tasks or implement particular abstract data types. The processor (e.g., 1010) of the computing system 1000 may execute instructions written in the program module to perform (or control) the functions or operations described hereinabove with reference to FIGS. 2, 3A-3C, 4, 5A, and 5B. The program module may be programmed into the integrated circuits of the processor (e.g., 1010). In an exemplary embodiment, the program module may be stored in the memory system (e.g., 1030) or in a remote computer system storage media.

The computing system 1000 may include a variety of computing system readable media. Such media may be any available media that is accessible by the computer system (e.g., 1000), and it may include both volatile and non-volatile media, removable and non-removable media.

The memory system (e.g., 1030) can include computer system readable media in the form of volatile memory, such as random access memory (RAM) and/or cache memory or others. The computer system (e.g., 1000) may further include other removable/non-removable, volatile/non-volatile computer system storage media.

The computer system (e.g., 1000) can communicate with one or more devices using the network adapter (e.g., 1050). The network adapter may support wired communications based on Internet, local area network (LAN), wide area network (WAN), or the like, or wireless communications based on code division multiple access (CDMA), global system for mobile communication (GSM), wideband CDMA, CDMA-2000, time division multiple access (TDMA), long term evolution (LTE), wireless LAN, Bluetooth, or the like.

Exemplary embodiments of the present disclosure may include a system, a method, and/or a computer program product. The computer program product may include a non-transitory computer readable storage medium (e.g., the memory system 1030) having computer readable program instructions thereon for causing a processor to carry out aspects of the present disclosure.

The computer readable storage medium can be a tangible device that can retain and store instructions for use by an instruction execution device. The computer readable storage medium may be, for example, but not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, or the like, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to the computing system 1000 from the computer readable storage medium or to an external computer or external storage device via a network. The network may include copper transmission cables, optical transmission fibers, wireless transmission, routers, firewalls, switches, gateway computers and/or edge servers. A network adapter card (e.g., 1050) or network interface in each computing/processing device receives computer readable program instructions from the network and forwards the computer readable program instructions for storage in a computer readable storage medium within the computing system.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the computing system (e.g., 1000) through any type of network, including a LAN or a WAN, or the connection may be made to an external computer (for example, through the Internet using an Internet Service Provider). In an exemplary embodiment, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, device, and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description, but is not intended to be exhaustive or limited to the present disclosure in the form disclosed. Many modifications and variations will be apparent to those of ordinary skill in the art without departing from the scope and spirit of the present disclosure. The embodiment was chosen and described in order to best explain the principles of the present disclosure and the practical application, and to enable others of ordinary skill in the art to understand the present disclosure for various embodiments with various modifications as are suited to the particular use contemplated.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A computer-implemented method for performing a coupled noise analysis in an integrated circuit (IC) design, the method comprising:
    copying one or more victim circuit sections of a victim circuit in the IC design;
    generating a blockage circuit section that represents a blockage aggressor circuit in the IC design, using the copied one or more victim circuit sections of the victim circuit, wherein the one or more victim circuit sections are directly connected to the blockage circuit section through at least one coupling capacitor;
    determining a first subcircuit from the blockage circuit section, wherein circuit elements constituting the first subcircuit are all connected one to another within the blockage circuit section,
    selecting, for a first victim pin on the victim circuit, a first power-driven virtual node on the first subcircuit;
    applying a first power source to the selected first power-driven virtual node on the first subcircuit;
    calculating a first coupled noise at the first victim pin contributed by the first subcircuit in response to the first power source being applied;
    comparing the first coupled noise at the first victim pin to a threshold noise level; and
    altering the IC design when the first coupled noise exceeds the threshold noise level.

2. The method of claim 1, further comprising:
    determining a second subcircuit from the blockage circuit section, wherein circuit elements constituting the second subcircuit are all connected one to another within the blockage circuit section.

3. The method of claim 2, further comprising:
    selecting, for the first victim pin, a second power-driven virtual node on the second subcircuit;
    applying a second power source to the selected second power-driven virtual node on the second subcircuit; and
    calculating a second coupled noise at the first victim pin contributed by the second subcircuit in response to the second power source being applied.

4. The method of claim 3, further comprising:
    determining a sum of the first coupled noise and the second coupled noise as a total coupled noise at the first victim pin contributed by the first subcircuit and the second subcircuit.

5. The method of claim 3, wherein the applying a first power source to the selected first power-driven virtual node on the first subcircuit and the applying a second power source to the selected second power-driven virtual node on the second subcircuit are made independently.

6. The method of claim 3, wherein the applying of the first and second power sources to the respective first and second power-driven virtual nodes are made simultaneously.

7. The method of claim 2, wherein the first subcircuit is electrically isolated from the second subcircuit within the blockage circuit section.

8. The method of claim 2, further comprising:
    identifying adjacent a first coupling capacitor and a second coupling capacitor coupled between the blockage circuit section and the one or more victim circuit sections;
    determining a distance between the first coupling capacitor and the second coupling capacitor; and
    when the distance of the first coupling capacitor and the second coupling capacitor exceeds a reference distance, determining that one portion of the blockage circuit section coupled to the first coupling capacitor and another portion of the blockage circuit section coupled to the second coupling capacitor are respectively two subcircuits which are electrically isolated from each other within the blockage circuit section.

9. The method of claim 1, wherein the altering the IC design comprises at least one of:
    rerouting of wire paths associated with the first victim pin; and
    redeploying of one or more circuit element in the IC design.

10. The method of claim 1, wherein the selecting, for a first victim pin on the victim circuit, a first power-driven virtual node on the first subcircuit comprises selecting a node with a shortest distance to the first victim pin as the first power-driven virtual node on the first subcircuit.

11. A computer system for performing a coupled noise analysis in designing an integrated circuit (IC), the computer system comprising:
    a memory device storing machine executable instructions; and
    at least one processing device coupled to the memory device, the at least one processing device configured to run the machine executable instructions to perform:
    copying one or more victim circuit sections of a victim circuit in the IC;
    generating a blockage circuit section that represents a blockage aggressor circuit in the IC, using the copied one or more victim circuit sections of the victim circuit, wherein the one or more victim circuit sections are directly connected to the blockage circuit section through at least one coupling capacitor;

determining a first subcircuit from the blockage circuit section, wherein circuit elements constituting the first subcircuit are all connected one to another within the blockage circuit section, selecting, for a first victim pin on the victim circuit, a first power-driven virtual node on the first subcircuit;

applying a first power source to the selected first power-driven virtual node on the first subcircuit;

calculating a first coupled noise at the first victim pin contributed by the first subcircuit in response to the first power source being applied;

comparing the first coupled noise at the first victim pin to a threshold noise level; and altering the IC design when the first coupled noise exceeds the threshold noise level.

12. The computer system of claim 11, wherein the at least one processing device is further configured to perform:

determining a second subcircuit from the blockage circuit section, wherein circuit elements constituting the second subcircuit are all connected one to another within the blockage circuit section.

13. The computer system of claim 12, wherein the at least one processing device is further configured to perform:

selecting, for the first victim pin, a second power-driven virtual node on the second subcircuit;

applying a second power source to the selected second power-driven virtual node on the second subcircuit; and calculating a second coupled noise at the first victim pin contributed by the second subcircuit in response to the second power source being applied.

14. The computer system of claim 13, wherein the at least one processing device is further configured to perform:

determining a sum of the first coupled noise and the second coupled noise as a total coupled noise at the first victim pin contributed by the first subcircuit and the second subcircuit.

15. The computer system of claim 11, wherein the selecting, for a first victim pin on the victim circuit, a first power-driven node on the first subcircuit, the at least one processing device is further configured to perform:

selecting a node with a shortest distance to the first victim pin as the first power-driven virtual node on the first subcircuit.

16. A computer program product stored in a non-transitory computer-readable storage medium having computer readable program instructions, the computer readable program instructions read and carried out a method by a processing device for performing a coupled noise analysis in an integrated circuit (IC) design, wherein the method comprises:

copying one or more victim circuit sections of a victim circuit in the IC design;

generating a blockage circuit section that represents a blockage aggressor circuit in the IC design, using the copied one or more victim circuit sections of the victim circuit, wherein the one or more victim circuit sections are directly connected to the blockage circuit section through at least one coupling capacitor;

determining a first subcircuit from the blockage circuit section, wherein circuit elements constituting the first subcircuit are all connected one to another within the blockage circuit section, selecting, for a first victim pin on the victim circuit, a first power-driven virtual node on the first subcircuit;

applying a first power source to the selected first power-driven virtual node on the first subcircuit;

calculating a first coupled noise at the first victim pin contributed by the first subcircuit in response to the first power source being applied;

comparing the first coupled noise at the first victim pin to a threshold noise level; and altering the IC design when the first coupled noise exceeds the threshold noise level.

17. The computer program product of claim 16, the method further comprises:

determining a second subcircuit from the blockage circuit section, wherein circuit elements constituting the second subcircuit are all connected one to another within the blockage circuit section.

18. The computer program product of claim 17, the method further comprises:

selecting, for the first victim pin, a second power-driven virtual node on the second subcircuit;

applying a second power source to the selected second power-driven virtual node on the second subcircuit; and calculating a second coupled noise at the first victim pin contributed by the second subcircuit in response to the second power source being applied.

19. The computer program product of claim 18, wherein the method further comprises:

determining a sum of the first coupled noise and the second coupled noise as a total coupled noise at the first victim pin contributed by the first subcircuit and the second subcircuit.

20. The computer program product of claim 16, wherein the selecting, for a first victim pin on the victim circuit, a first power-driven virtual node on the first subcircuit comprises selecting a node with a shortest distance to the first victim pin as the first power-driven virtual node on the first subcircuit.

* * * * *